(12) United States Patent
Chen et al.

(10) Patent No.: US 8,227,269 B2
(45) Date of Patent: Jul. 24, 2012

(54) MANUFACTURE OF LIGHT EMITTING DEVICES WITH PHOSPHOR WAVELENGTH CONVERSION

(75) Inventors: Geng Chen, Fremont, CA (US); Jonathan Melman, San Ramon, CA (US)

(73) Assignee: Intematix Corporation, Fremont, CA (US)

( * ) Notice: Subject to any disclaimer, the term of this patent is extended or adjusted under 35 U.S.C. 154(b) by 251 days.

(21) Appl. No.: 12/782,847

(22) Filed: May 19, 2010

(65) Prior Publication Data

US 2010/0295078 A1    Nov. 25, 2010

Related U.S. Application Data

(60) Provisional application No. 61/179,668, filed on May 19, 2009.

(51) Int. Cl.
*H01L 21/00* (2006.01)
*H01L 33/00* (2010.01)

(52) U.S. Cl. ......... 438/26; 438/33; 438/460; 438/463; 257/99; 257/100; 257/E33.056; 257/E33.059; 257/E21.599

(58) Field of Classification Search ............... 438/26, 438/33, 460, 463; 257/99, 100, E33.056, 257/E33.059, E21.599
See application file for complete search history.

(56) References Cited

U.S. PATENT DOCUMENTS

| | | | |
|---|---|---|---|
| 5,998,925 A | 12/1999 | Shimizu | |
| 7,049,159 B2 | 5/2006 | Lowery | |
| 7,311,858 B2 | 12/2007 | Wang | |
| 7,344,952 B2 | 3/2008 | Chandra | |
| 7,390,437 B2 | 6/2008 | Dong | |
| 7,575,697 B2 | 8/2009 | Li | |
| 7,585,751 B2 * | 9/2009 | Kirihara et al. | 438/462 |
| 7,601,276 B2 | 10/2009 | Li | |
| 7,863,160 B2 * | 1/2011 | Iizuka | 438/463 |
| 7,897,488 B2 * | 3/2011 | Watanabe et al. | 438/463 |
| 2005/0274967 A1 * | 12/2005 | Martin et al. | 257/98 |
| 2006/0009008 A1 * | 1/2006 | Kaneuchi et al. | 438/463 |
| 2006/0097621 A1 | 5/2006 | Park et al. | |
| 2006/0158090 A1 | 7/2006 | Wang et al. | |
| 2006/0284207 A1 | 12/2006 | Park et al. | |
| 2007/0029526 A1 | 2/2007 | Cheng et al. | |
| 2008/0020548 A1 * | 1/2008 | Morikazu et al. | 438/463 |
| 2008/0076198 A1 | 3/2008 | Park et al. | |
| 2008/0111472 A1 | 5/2008 | Liu et al. | |
| 2008/0132035 A1 * | 6/2008 | Kondo | 438/463 |
| 2008/0268619 A1 * | 10/2008 | Nakamura | 438/463 |
| 2009/0117672 A1 | 5/2009 | Caruso et al. | |
| 2009/0134414 A1 | 5/2009 | Li et al. | |
| 2009/0283721 A1 | 11/2009 | Liu et al. | |
| 2010/0304551 A1 * | 12/2010 | Takanashi et al. | 438/463 |

* cited by examiner

*Primary Examiner* — David Zarneke
(74) *Attorney, Agent, or Firm* — Fliesler Meyer LLP

(57) ABSTRACT

A method of manufacturing a light emitting device comprises: a) depositing over substantially the entire surface of a LED diode wafer having an array of LEDs formed on a surface thereof a mixture of at least one phosphor material and a polymer material, wherein the polymer material is transmissive to light generated by the LEDs and to light generated by the at least one phosphor material; b) mechanically stamping the phosphor/polymer mixture with a stamp having features configured such as to form passages in the phosphor/polymer corresponding to electrode contact pads of each LED thereby enabling access to each electrode contact pad; c) curing the polymer; d) removing the stamp; and e) dividing the LED wafer into individual light emitting devices. The stamp comprises a dissolvable material (polyvinyl alcohol) and the stamp is removed by dissolving it using a solvent (e.g. water).

23 Claims, 12 Drawing Sheets

MANUFACTURE OF LIGHT EMITTING DEVICES WITH PHOSPHOR WAVELENGTH CONVERSION

CROSS-REFERENCE TO RELATED APPLICATIONS

This application claims the benefit of priority of U.S. Provisional Application No. 61/179,668, filed May 19, 2009, the contents of which are incorporated herein by reference.

BACKGROUND OF THE INVENTION

1. Field of the Invention

The invention relates to methods of manufacture of light emitting devices with phosphor wavelength conversion. More particularly the invention concerns a method of applying a phosphor material to a light emitting diode (LED).

2. Description of the Related Art

White light emitting LEDs ("white LEDs") are known in the art and are a relatively recent innovation. It was not until LEDs emitting in the blue/ultraviolet part of the electromagnetic spectrum were developed that it became practical to develop white light sources based on LEDs. As taught, for example in U.S. Pat. No. 5,998,925, white LEDs include one or more phosphor materials, that is photo-luminescent materials, which absorb a portion of the radiation emitted by the LED and re-emit radiation of a different color (wavelength). Typically, the LED chip or die generates blue light and the phosphor(s) absorbs a percentage of the blue light and re-emits yellow light or a combination of green and red light, green and yellow light, green and orange or yellow and red light. The portion of the blue light generated by the LED that is not absorbed by the phosphor combined with the light emitted by the phosphor provides light which appears to the human eye as being nearly white in color.

An example of the manufacture of a gallium nitride (GaN) based white LED is shown schematically in FIGS. 1a to 1d. As shown in FIG. 1a an LED wafer 10 comprises a wafer (substrate) 12, typically sapphire, that has one or more layers of n-type gallium nitride 14 and p-type gallium nitride 16 materials epitaxially grown on its surface and configured to define a plurality of LED chips 18. Each LED chip 18 has respective n-type and p-type electrode pads 20, 22 on its upper surface for providing electrical connection to the chip. As is known in other device structures one or both electrode pads 20, 22 can be provided on the substrate side of the LED. To fabricate a white LED the LED wafer is 10 is divided (diced) into individual LED chips 18 by for example laser scribing and breaking or by mechanical sawing using a diamond saw (FIG. 1b). Each LED chip 18 is then individually mounted in a package (housing) 24 or mounted to a lead frame (FIG. 1c).

The package 24, which can for example comprise a low temperature co-fired ceramic (LTCC) or high temperature polymer, comprises upper and lower body parts 26, 28. The upper body part 26 defines a recess 30, often circular in shape, which is configured to receive one or more LED chips 18. The package 24 further comprises electrical connectors 32, 34 that also define corresponding electrode contact pads 36, 38 on the floor of the recess 30. Using adhesive or soldering the LED chip 18 is mounted to the floor of the recess 30. The LED chip's electrode pads 20, 22 are electrically connected to corresponding electrode contact pads 36, 38 on the floor of the package using bond wires 40, 42. The recess 30 is then completely filled with a transparent polymer material 44, typically a silicone, which is loaded with the powdered phosphor material(s) such that the entire surface of the LED chip is covered by the phosphor/polymer mixture. To enhance the emission brightness of the device the inner walls of the recess 30 are often inclined and light reflective. Optionally, a lens (not shown), whose dimensions correspond to the dimensions of the recess, is mounted on the package to focus or otherwise direct the light emission of the device.

A drawback with such a method of manufacture is cost, since phosphor has to be applied to the LED chip on an individual basis. In addition the color hue of light generated by the device, or in the case of a white light emitting device the correlated color temperature (CCT), can vary significantly between devices that are supposed to be nominally the same. The problem of color/CCT variation is compounded by the fact that the human eye is extremely sensitive to subtle changes in color hue especially in the white color range. As is known, the correlated color temperature (CCT) of a white light source is determined by comparing its hue with a theoretical, heated black-body radiator. CCT is specified in Kelvin (K) and corresponds to the temperature of the black-body radiator which radiates the same hue of white light as the light source. The CCT of a white LED is generally determined by the phosphor composition, the quantity of phosphor incorporated in the device and its actual location/distribution.

As well as the variation between devices in the color/correlated color temperature (CCT) of emitted light, it is found that the color/CCT can vary across the light emitting surface of the device. The color/CCT depends on the thickness of phosphor/polymer and the distance (i.e. path length) that light travels from the LED chip through the phosphor/polymer encapsulation before being emitted from the device. As shown in FIG. 2, light 46 which is emitted substantially on axis will have traveled a shorter path length 48 within the phosphor/polymer encapsulation than light 50 emitted off axis towards the periphery of the device in which the path length 52 is correspondingly longer. As a result the light 46 emitted substantially on axis will have a higher proportion of blue light compared to yellow (phosphor generated light) and will appear to be blue-white in color. Conversely light 50 emitted off axis towards the periphery of the recess will have a correspondingly higher proportion of yellow light emitted by the phosphor and will appear yellow-white in color. For general lighting applications, where for example a diffuser is used, this variation in color is not a problem as the lit object itself will also increase illumination color uniformity.

Furthermore, in applications in which the device includes further optical components, in particular a lens, to focus the output light, such color/CCT variation can become a significant problem. For example for a white LED which includes a lens, the focused light spot will have a blue-white core with a pronounced yellow-white periphery.

In addition to the problem of non-uniformity in emitted color/CCT due to the variation in path length through the phosphor/polymer encapsulation, it is found that the phosphor material(s) can accumulate unevenly during curing of the liquid polymer resulting in a non-uniform distribution of the phosphor material(s) over the LED chip and in particular on the edges of the LED chip, which will also emit light, where there may be little or no phosphor material(s). As illustrated in FIG. 2 the phosphor material can accumulate on the bond wires 54, on the upper surface 56 of the LED chip, on the floor 58 of the recess and on the inclined light reflective walls 60 of the package. To overcome this problem a greater quantity of phosphor material is often used though this will result in a corresponding decrease in emitted light intensity. The inventor has appreciated that the variation in color hue can additionally depend on factors including:

variations in bonding wire shape and location which can affect the wetting of the phosphor adhesive bleed out which can affect the wetting of the phosphor variations in emission direction of the LED chip variations in the reflector characteristic variations or aging in the phosphor/silicone blend wavelength emission distribution of LED chips.

It is believed that all of these factors can affect the color hue/CCT of light generated by a light emitting device with phosphor wavelength conversion.

US 2006/0097621 teaches a method of manufacturing a white LED comprising dispensing droplets of a high viscosity liquid phosphor paste on an upper surface of the LED such that the phosphor paste is applied onto the upper surface and side surfaces of the LED and then curing the phosphor paste. The phosphor paste comprises a phosphor powder mixed with a transparent polymer resin and has a viscosity of 500~10,000 cps. The volume of the phosphor paste droplet and viscosity of the phosphor paste are selected such that the phosphor paste covers the upper surface and side surfaces of the LED and allows the phosphor paste to be uniformly applied to the side surfaces as well as the upper surface. After application of the phosphor paste the polymer resin is cured and the LED chip is connected to the package using bond wires. Finally the package is filled with a transparent polymer material to protect the bond wires.

As taught in our co-pending United States patent application publication No. US 2009/0134414, published Oct. 22, 2009, a method of fabricating a light emitting device comprises: heating a light emitting diode chip package assembly to a pre-selected temperature and dispensing a pre-selected volume of a mixture of at least one phosphor and a light transmissive thermosetting material (silicone, epoxy) on a surface of the LED chip. The pre-selected volume and temperature are selected such that the phosphor/material mixture flows over the entire light emitting surface of the LED chip before curing. In an alternative method, using a light transmissive UV curable material such as an epoxy, the phosphor/material mixture is irradiated with UV radiation after a pre-selected time to cure the material. The pre-selected volume and pre-selected time are selected such that the phosphor/material mixture flows over at least the light emitting surface of the LED chip before curing.

To alleviate the problem of color variation in light emitting devices with phosphor wavelength conversion, in particular white LEDs, are categorized post-production using a system of "bin out" or "binning" In binning, each LED is operated and the actual color of its emitted light measured. The LED is then categorized or binned according to the actual color of light the device generates rather than according to the target CCT with which it was produced. A disadvantage of binning is increased production costs and a low yield rate as often only two out of the nine bins are acceptable for an intended application resulting in supply chain challenges for white LED suppliers and customers.

Various methods of applying the phosphor to the LED chip have been proposed in an effort to improve coating uniformity and color hue and CCT consistency. For example, US 2008/0076198 describe a method of manufacturing an LED package comprising: forming a resin mold encapsulating an LED chip and then forming a phosphor thin film on a surface of the resin mold by spray coating a phosphor-containing material on the surface of the resin mold.

U.S. Pat. No. 7,344,952 describe a process for manufacturing LEDs that utilize phosphor wavelength conversion. LED dies (chips) are tested for CCT and binned according to their color emission. The LEDs in a single bin are mounted on a single submount (substrate) to form an array of LEDs. Various thin sheets of a flexible encapsulant (e.g. silicone) containing one or more phosphors are preformed, where each sheet has different color conversion properties. An appropriate sheet is place over an array of LEDs on a submount, and the LEDs are energized. The CCT of the emitted light is measured. If the CCT is acceptable, the phosphor sheet is permanently laminated onto the LEDs and submount. The LEDs in the array are separated into individual devices. By selecting a different phosphor sheet for each bin of LEDs, the resulting CCT is more consistent across the bins. Although such a process can produce LEDs with a more consistent CCT both the LED dies and phosphor sheet need to be binned and this can make the process expensive.

US 2005/0274967 teaches producing a sheet of wavelength converting (phosphor containing) material and then dividing the sheet into individual caps or elements. The light conversion characteristic of each cap is then measured and the caps binned according to their characteristic. The light emission characteristic of each packaged LED is measured and an appropriate cap bonded to the LED to produce a desired CCT of emitted light. Although this process can produce LEDs with a desired CCT, binning of LEDs and phosphor caps is required and this can make the process time consuming and expensive.

U.S. Pat. No. 7,049,159 describe forming a luminescent layer on light emitting devices that are mounted on a substrate. The method comprises positioning a stencil on a substrate such that the light emitting devices are located within a respective opening of the stencil, depositing a composition including the luminescent material in the opening, removing the stencil and curing the composition to a solid state.

US 2006/0284207 teach applying the phosphor material during formation of the LED package. LED chips are electrically connected to pattern electrodes on a substrate such as a PCB or ceramic substrate. Next an encapsulant, epoxy molding compound (EMC), containing the phosphor material is formed on each LED chip by transfer (injection) molding. After curing the encapsulant is cut around the periphery of the chip and a layer of a highly reflective metal formed on the periphery of the encapsulant by electrolysis, electro-plating or sputtering. The reflective layer defines the side wall of the packaged LED. Finally, the substrate is cut horizontally and vertically into individual LED packages.

In our co-pending United States patent application publication No. US 2009/0117672 A1, published May 7, 2009, a method of fabricating a light emitting device having a specific target color of emitted light is described. The method comprises: depositing a pre-selected quantity of the at least one phosphor material on a light emitting surface of the light emitting diode; operating the light emitting diode; measuring the color of light emitted by the device; comparing the measured color with the specific target color; and depositing and/or removing phosphor material to attain the desired target color.

A need exists still for a method of manufacturing light emitting devices with phosphor wavelength conversion that can produce devices with a more consistent color/CCT less expensively than the prior art solutions.

SUMMARY OF THE INVENTION

The present invention arose in an endeavor to address, at least in part, the problem of color hue and/or CCT variation of light emitting devices that include phosphor wavelength conversion and to reduce or even eliminate the need for binning packaged devices.

Embodiments of the invention are directed to processing and patterning the phosphor material for an entire LED wafer containing the light emitting devices prior to dividing and packaging individual LED chips. Unless otherwise indicated the term LED wafer refers to a wafer on which the LED chips are fabricated by depositing layers of n-type and p-type semiconductor materials. This is to be contrasted with a wafer or substrate onto which individual LED chips are mounted during packaging. By way of analogy with the chip manufacturing industry the method of the invention concerns providing the phosphor at the wafer level and can be considered as being at a level termed large scale integration (LSI).

According to the invention there is provided a method of manufacturing a light emitting device comprising: a) depositing over substantially the entire surface of a LED wafer having an array of LEDs formed on a surface thereof a mixture of at least one phosphor material and a polymer material, wherein the polymer material is transmissive to light generated by the LEDs and to light generated by the at least one phosphor material; b) mechanically stamping the phosphor/polymer mixture with a stamp having features configured such as to form passages in the phosphor/polymer corresponding to electrode contact pads of each LED thereby enabling access to each electrode contact pad; c) curing the polymer; d) removing the stamp; and e) dividing the LED wafer into individual light emitting devices.

Since there can, for a given LED wafer, be a significant variation in both intensity and wavelength of light emitted from individual LEDs that are nominally the same, the LED wafer is preferably first mapped and the intensity and wavelength of light from each LED measured. The required thickness and weight loading of phosphor to light transmissive polymer of the phosphor/polymer material to achieve a selected CCT of light emitted from the device can be calculated from the LED wafer mapping. Every LED on the wafer can be mapped or a representative sample, such as ≈50%, mapped. To avoid the need to remove phosphor, the phosphor loading and/or thickness of the layer of phosphor/polymer material can be selected to correspond to LED chips requiring the least amount of phosphor. Those devices out of specification can be brought within specification by the subsequent addition of additional phosphor for example when the device is packaged. Alternatively the loading and/or of the phosphor/polymer material can be selected to maximize the number of devices having a selected CCT of emission product. Advantageously in accordance with the invention the method further comprises selecting a thickness of the phosphor/polymer material and weight loading of the at least one phosphor material to polymer material of the phosphor/polymer material on a basis of LEDs on the LED wafer having substantially the same emission characteristics. In one method the selection is made on a basis of LEDs that emit light of substantially the same intensity and/or emission wavelength. Additionally the selection can be made on a basis of the LEDs requiring a least amount of phosphor material and additional phosphor provided to devices to ensure they emit light of a selected color and/or CCT. Alternatively and to maximize the yield of devices from the wafer, the selection can be made on the basis of the greatest number of LEDs on the LED wafer having substantially the same emission characteristics.

Preferably, the stamp further comprises features, such as ribs, for defining slots in the phosphor/polymer material that are configured to pass between individual LEDs. Such slots aid in the subsequent division of the LED wafer. Alternatively, prior to dividing the LED wafer in e) the method can further comprises cutting slots through the phosphor/polymer material that are configured to pass between individual LEDs. To further aid in the subsequent division of the wafer the slots advantageously further extend partially into the LED wafer. The slots can be cut by laser ablation or mechanical sawing using for example a diamond saw. The slots are preferably configured such that a layer of phosphor/polymer material remains on the edges of each LED after division of the wafer into individual devices.

It is envisaged in one arrangement that the stamp is a single-use item and is fabricated from a dissolvable material, such as for example polyvinyl alcohol (PVA). Such a stamp can be removed by dissolving it using a solvent such as water.

Alternatively the stamp can be a multiple-use item and can comprise for example a metal such as stainless steel, a polymer material such as a polycarbonate, an acrylic, a silicone or an epoxy or a glass. Preferably the stamp further comprises a coating of, or is fabricated from, a non-stick material such as PTFE (polytetrafluoroethylene) for example Teflon® ("Teflon" is a registered trademark of Du Pont) to aid in the removal of the stamp. Moreover, the stamp can be resiliently deformable to assist in its removal and a release agent can be used to further aid in removal of the stamp.

The polymer material can comprise a thermally or ultra violet (U.V.) curable material such as a silicone or epoxy material. When a U.V. curable polymer is the used the stamp can comprise a material which substantially transmissive to U.V. radiation and the polymer material cured in c) by irradiating the phosphor/polymer mixture with U.V. radiation through the stamp. Alternatively, where the polymer material is thermally curable the stamp can be heated to cure the polymer material.

Prior to dividing the LED wafer in e) the LED wafer is advantageously processed, using for example plasma ashing, to remove phosphor/polymer overlying the electrode contact pads. Such residual phosphor/polymer can otherwise prevent electrical contact being made to the LED electrode contact pads.

The LED wafer can be divided into individual devices by scribing and breaking, laser ablation or sawing.

According to a further aspect of the invention there is provided a light emitting device with phosphor wavelength conversion manufactured according to the method of the invention.

BRIEF DESCRIPTION OF THE DRAWINGS

In order that the present invention is better understood embodiments of the invention will now be described, by way of example only, with reference to the accompanying drawings in which:

FIG. 5b is a schematic sectional representation along a line A-A of a method of fabricating the stamp of FIG. 5a;

DETAILED DESCRIPTION OF THE INVENTION

Embodiments of the invention concern methods of manufacturing a light emitting device with phosphor wavelength conversion and in particular methods of applying/processing the phosphor material on an LED wafer prior to division of the wafer into individual LED chips. More particularly the method concerns patterning of the phosphor material to enable electrical connections to be made to the LED chip's electrode contacts once the wafer is subsequently divided into individual LED chips. The term "LED wafer" refers to a wafer (substrate) on which the LED chips are fabricated by depositing layers of n-type and p-type semiconductor materials. This is to be contrasted with a wafer (substrate) onto which individual LED chips are mounted post fabrication.

Figures 1A, 1B, 1C, 1D:
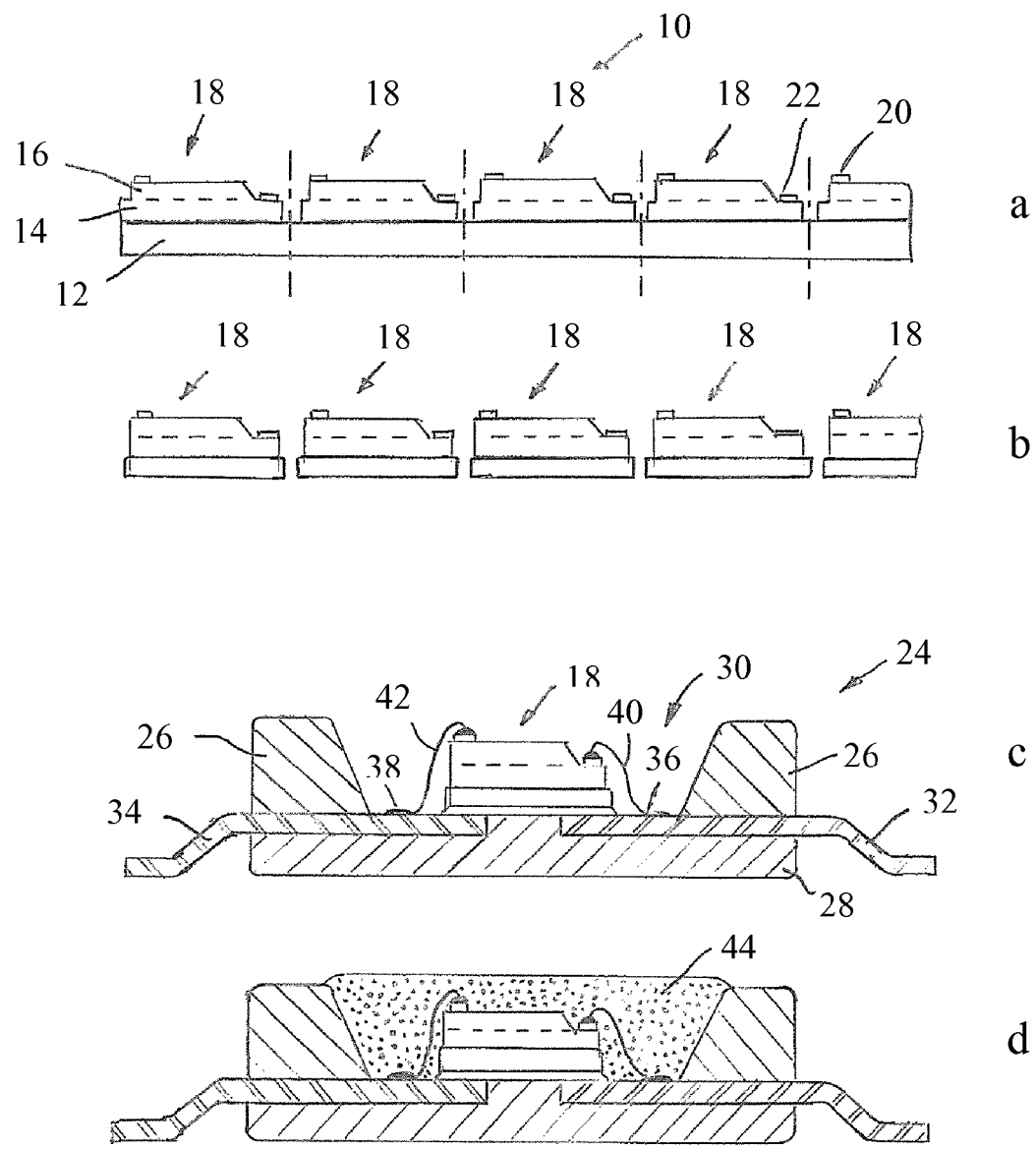
FIGS. 1a to 1d are schematic representations of a known method of manufacture of a light emitting device with phosphor wavelength conversion as previously described.
Figure 2:
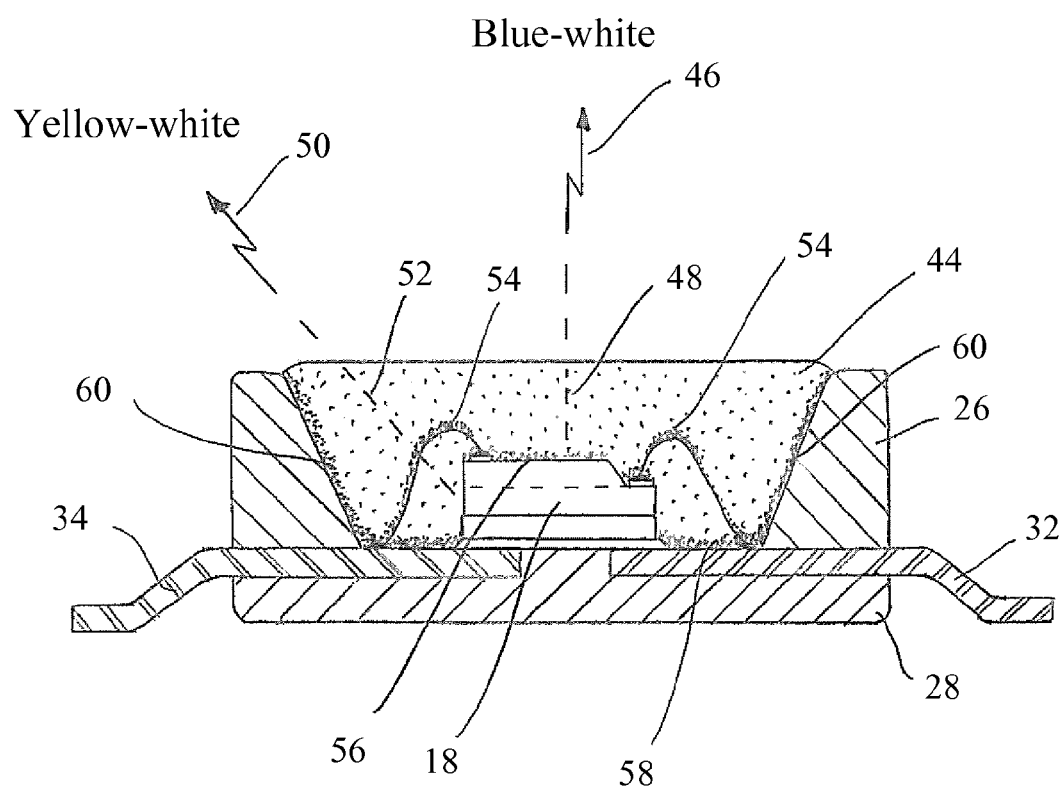
FIG. 2 is a schematic sectional representation of a known light emitting device with phosphor wavelength conversion as previously described.
Figure 3:
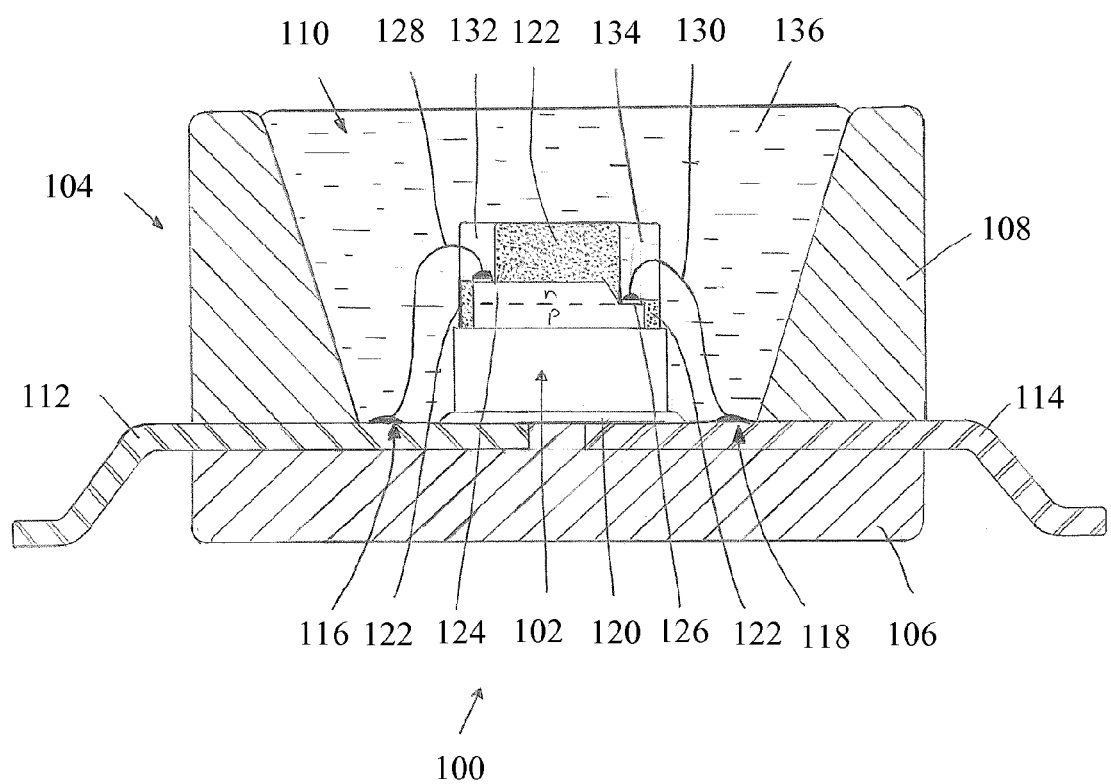
FIG. 3 is a schematic sectional view of a light emitting device with wavelength conversion in accordance with the invention.

In this specification like reference numerals are used to denote like parts. FIG. 3 is a schematic sectional view of a white light emitting device 100 with phosphor wavelength conversion in accordance with the invention. The device 100 is based on a surface emitting LED chip 102, such as for example a gallium nitride (GaN) based LED chip that emits blue light of wavelength ≈400 nm to ≈450 nm. The LED chip 102 is packaged in a package (housing) 104. The package 104, which can for example comprise a low temperature co-fired ceramic (LTCC) or high temperature polymer, comprises lower and upper body parts 106, 108. The upper body part 108 defines a recess 110, typically circular in shape, which is configured to receive the LED chip 102. The package 104 further comprises electrical connectors 112, 114 that define corresponding electrode contact pads 116, 118 on the floor of the recess 110. Using an adhesive or eutectic soldering 120 the LED chip 102 is mounted to the floor of the recess 110. In accordance with the invention the LED chip 102 further comprises a coating of a phosphor/polymer material 122 over its light emitting surface (i.e. upper surface as illustrated). The phosphor/polymer layer 122 also extends over the edges of the LED chip 102 which will, to a lesser extent, also emit light. N-type and p-type electrode pads 124, 126 on the upper surface of the LED chip 102 are electrically connected to a corresponding electrode contact pad 116, 118 on the floor of the package by bond wires 128, 130 that pass through a respective passage (aperture) 132, 134 in the phosphor/polymer layer 122. Having electrically connected the LED chip 102 the recess 110 is then completely filled with a transparent polymer material 136, typically a silicone, to protect the bond wires 128, 130.

Figure 4:
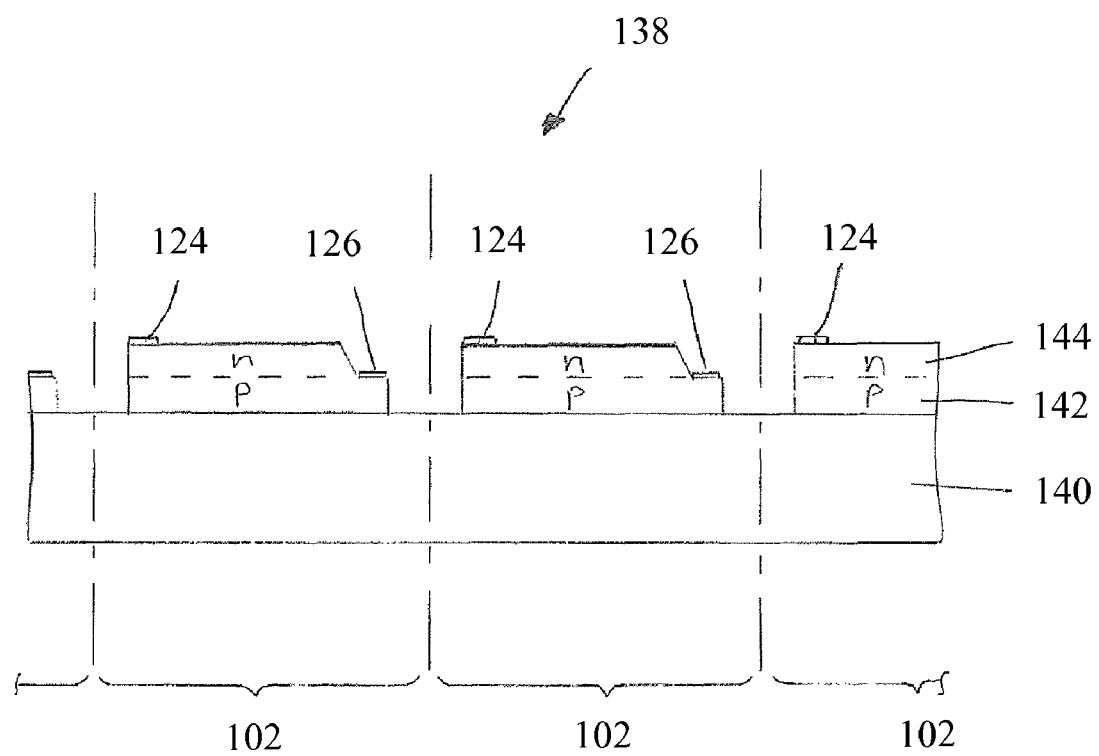
FIG. 4 is a schematic sectional view of a light emitting diode (LED) wafer.

Methods in accordance with the invention will be described in relation to the manufacture of the white light emitting device 100 of FIG. 3 and in particular to the application/processing of the phosphor/polymer layer 122 on the LED chip 102. FIG. 4 is a schematic sectional view of a GaN-based LED wafer 138. The LED wafer 138 comprises a sapphire ($Al_2O_3$) wafer (substrate) 140 on a surface of which there is fabricated a plurality of LED chips 102 in which each LED chip comprises p-type and n-type Ga—N-based material layers 142, 144 and the n-type and p-type electrodes 124, 126. It will be appreciated that the LED chips shown are highly simplified and intended to be exemplary only. In practice each LED chip will comprise more complex architectures such as for example single quantum well (SQW) or multiple quantum well (MQW) structures, one or more pumping or current spreading layers, n-type and p-type cladding layers, buried electrode layers etc. Whilst in the example described each LED 102 has n-type and p-type electrodes 124, 126 that are located on the upper light emitting surface, the method of the invention applies equally to LEDs having other electrode configurations such as those in which there is one electrode on the light emitting face and an electrode plane on an opposite face. Typically the sapphire wafer 102 is a two inch diameter circular wafer of thickness ≈500 nm on which between 500 and 10,000 LEDs 102 are fabricated. The method will be described in relation to the application/processing of the phosphor/polymer layer 122 on a two inch wafer with ≈1500, 1 mm×1 mm LED chips 102.

Method 1

A method in accordance with a first embodiment of the invention will be described in relation to FIGS. 5a and 5b and FIGS. 6a to 6g which respectively show a perspective schematic representation of a stamp used in the method of the invention, a schematic sectional representation along a line A-A of a method of fabricating the stamp of FIG. 5a and schematic representations of the method steps of the invention for fabricating the white light emitting device 100 of FIG. 3 with a specific CCT (for example 3000K).

Figure 5A:
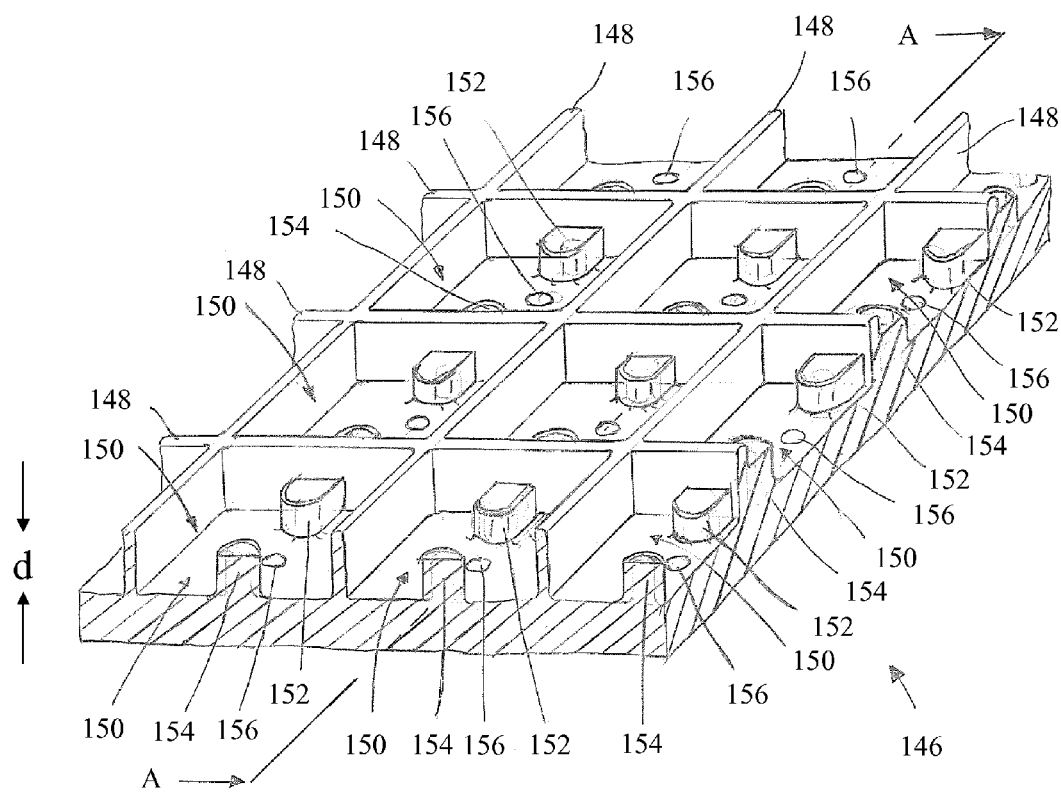
FIG. 5a is a perspective schematic representation of a stamp used in the method of the invention.

FIG. 5a is a perspective schematic representation of a stamp 146 used in the method of the invention to configure the phosphor/polymer coating 122. For ease of understanding the stamp 146 is illustrated in an inverted orientation in FIG. 5a with the upper part being that which will engage the phosphor/polymer 122 during operation. The stamp 146 comprises a grid of ribs 148 that define an array of cells 150 that are configured such that each cell 150 corresponds to a respective LED chip 102. As will be further described the ribs are used to produce a corresponding grid of slots 164 in the phosphor/polymer coating 122 to assist in division of the wafer 138 into individual devices. The slots 164 run in mutually orthogonal directions (x- and y-directions) to form a square grid of slots 164 that pass through the entire thickness of the phosphor/polymer layer 122 and hereinafter the slots will be referred to as "streets" and "avenues". The streets and avenues (slots) are configured to run between LED chips 102 and correspond to where the LED wafer 143 will be subsequently divided into individual LED chips 102.

Each cell 150 further includes two upwardly extending features 152, 154 that abut opposite ribs 148 of the cell and a through-hole 156 in the floor of each cell 150. Each feature is configured to correspond to a respective LED electrode 124, 126 such that during stamping the feature 152, 154 will respectively form the passages (apertures) 132, 134 in the phosphor/polymer layer 122 thereby enabling electrical access to the LED's electrodes 124, 126. As shown the features can be generally cuboid in form such that the passages 132, 134 will be slot shaped in form and located at the edge of each LED. Typically, in a surface emitting LED the electrodes 124, 126 are located on the light emitting face close to the edges of the chip to maximize LED light emission. To enable wire bonding to the electrodes it is preferable to have a passage of a size 50 μm to 100 μm resulting in the passages extending into the slots 164. As will be described the through-holes 156 are provided to allow the escape of excess 160 phosphor/polymer material from each cell 150 during stamping. The stamp is preferably fabricated from a dissolvable polymer material such as for example a polyvinyl alcohol (PVA).

Figure 5B:
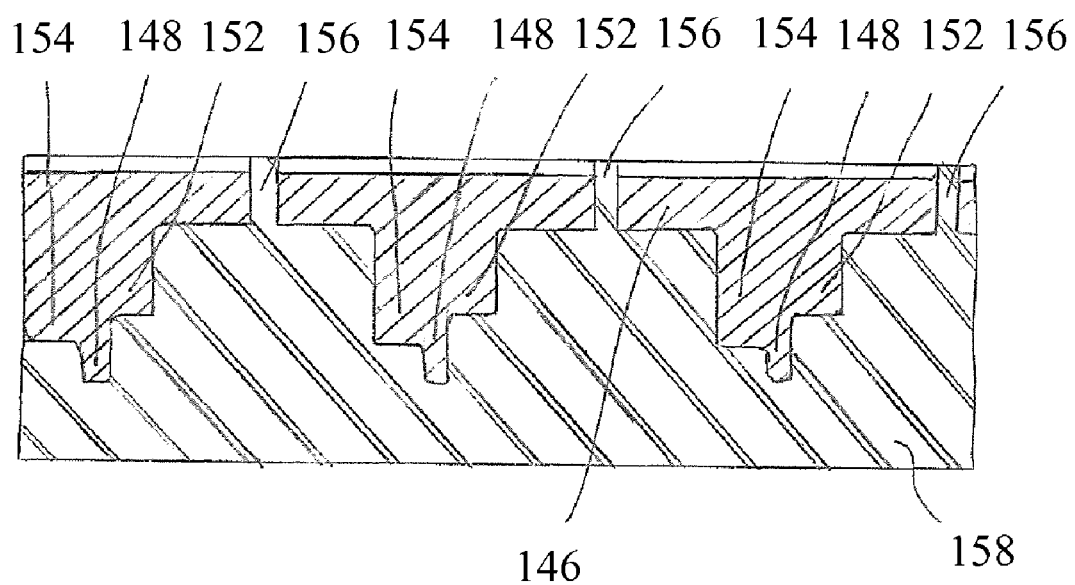

FIG. 5b is a schematic a schematic sectional representation along a line A-A (FIG. 5a) showing a method of fabricating the stamp 154. The stamp 154 is advantageously fabricated by molding using a liquid polymer in a stamp mold 158. To aid in removal of the stamp 154 from the stamp mold 158 a release agent can be applied to the surfaces of the stamp mold.

Figures 6A, 6B:
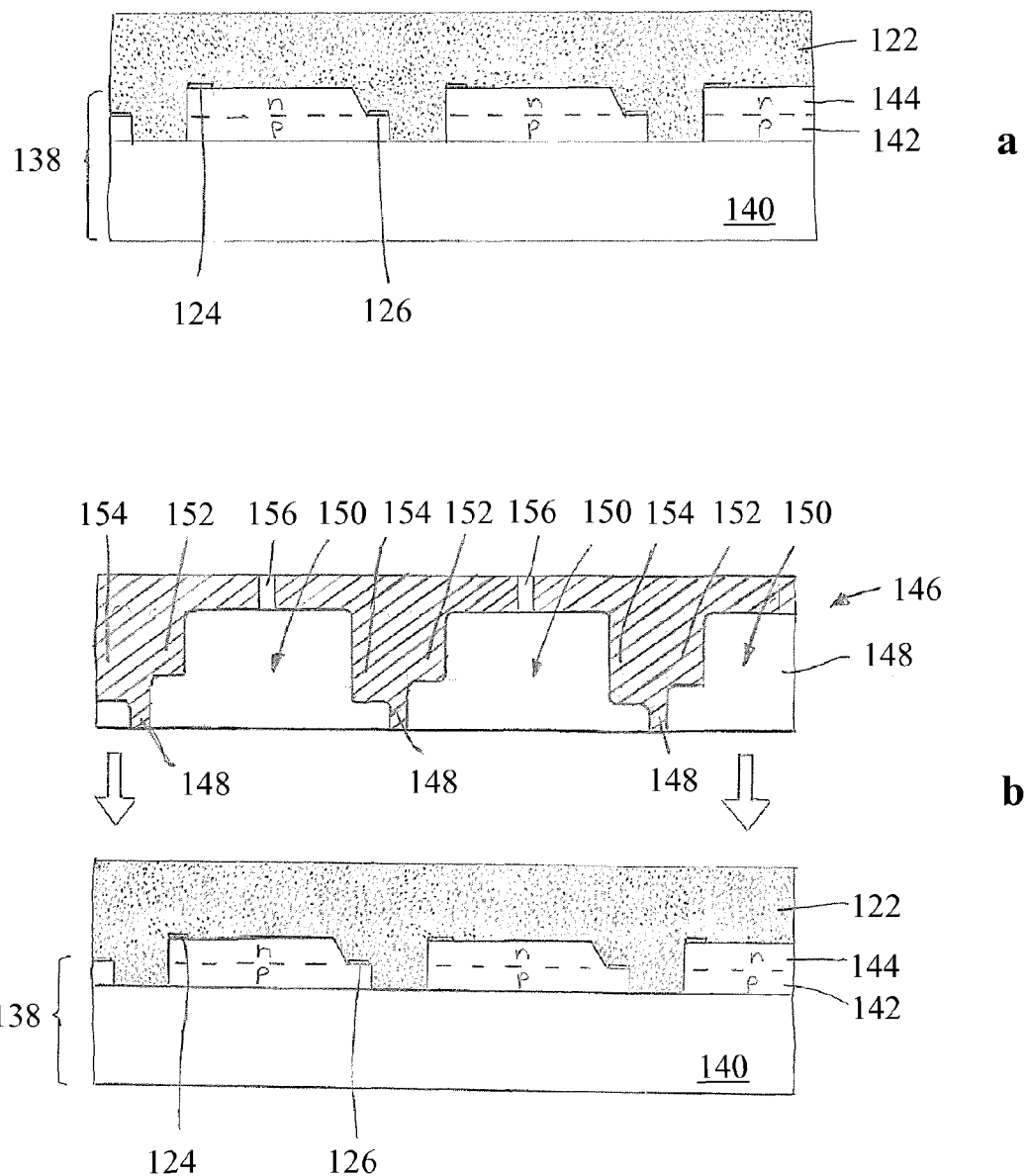
FIGS. 6a to 6g are schematic representations of method steps for manufacturing the light emitting device of FIG. 3 according to a method of the invention.

Step 1—FIG. 6a: First the phosphor (photoluminescent) material, which is in powder form, is thoroughly mixed in pre-selected proportions with a light transmissive (transparent) polymer material such as for example a light transmissive (transparent) silicone or epoxy. The polymer material can be thermally curable or ultra violet (U.V.) curable. In this exemplary implementation the polymer material is U.V. curable and the stamp is fabricated from a material that is transmissive to U.V. radiation. Examples of light transmissive polymer materials can include Shin-Etsu MicroSi, Inc's flexible silicone KJR-9022 and GE's silicone RTV615. The weight ratio loading of phosphor to silicone is typically in a range 35 to 85 parts per 100 with the exact loading depending on the required CCT of the emission product of the device. The phosphor/polymer mixture is deposited over the face of the LED wafer 138 on which the LED chips 102 are fabricated such as to form a layer 122 over the entire surface of the LED wafer 138. As can be seen in FIG. 6a the phosphor/polymer mixture 122 not only forms a layer over the entire light emitting surface (i.e. upper surface as shown) of each LED chip 102 but also fills the space between adjacent LED chips which as will be described eventually forms a phosphor/polymer coating on the edges of each LED chip. The phosphor/polymer layer 122 is conveniently applied to the wafer by spin-coating, doctor blading, tape-casting, spraying, inkjet printing or by other deposition techniques that will be apparent to those skilled in the art.

Figure 6C:
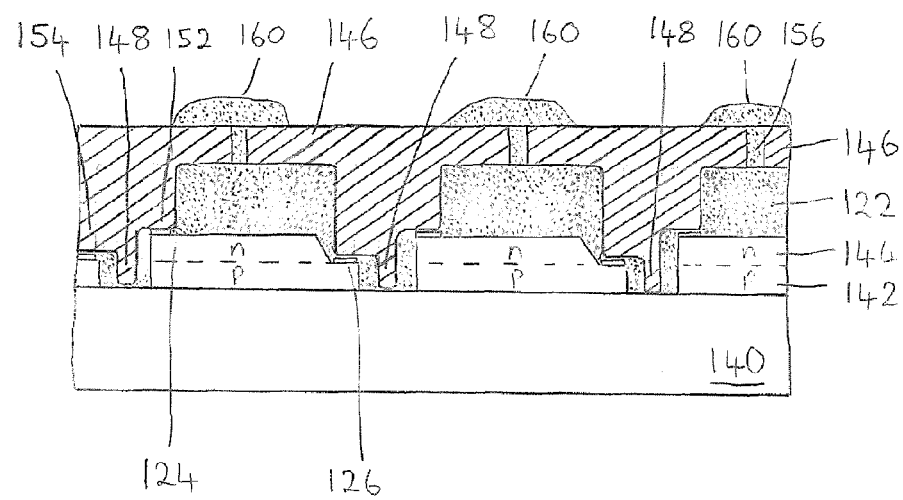
Figure 6D:
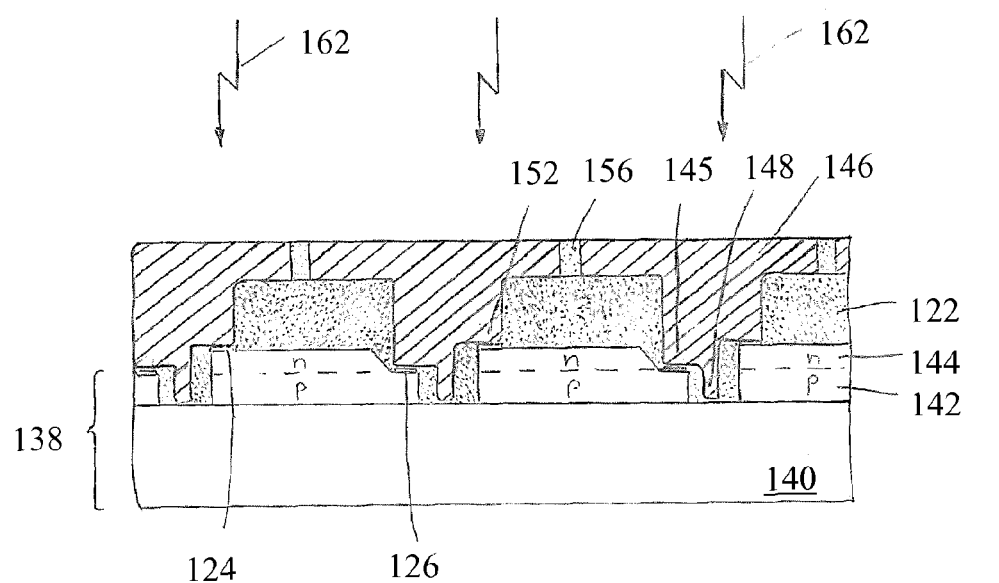
Figure 6E:
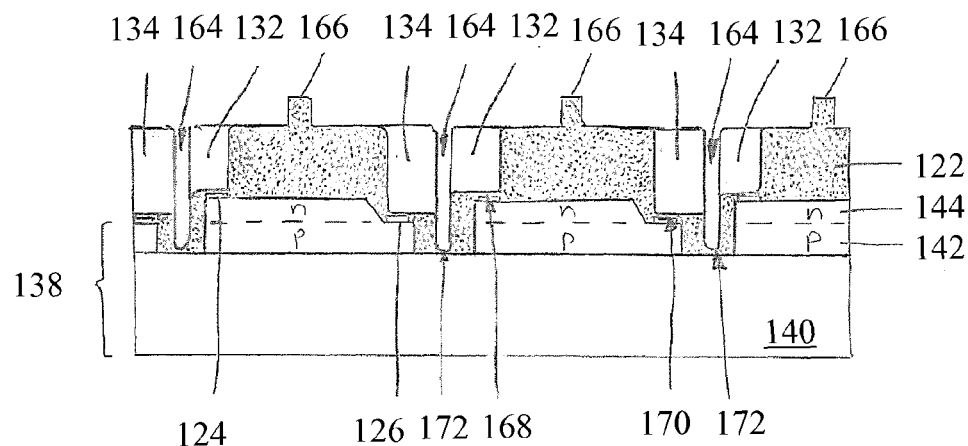
Figure 6F:
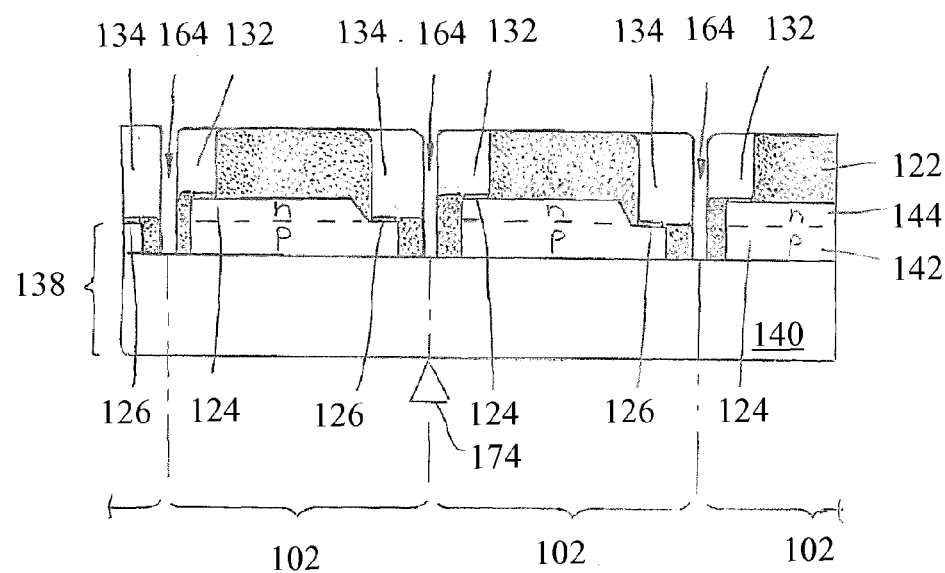
Figure 6G:
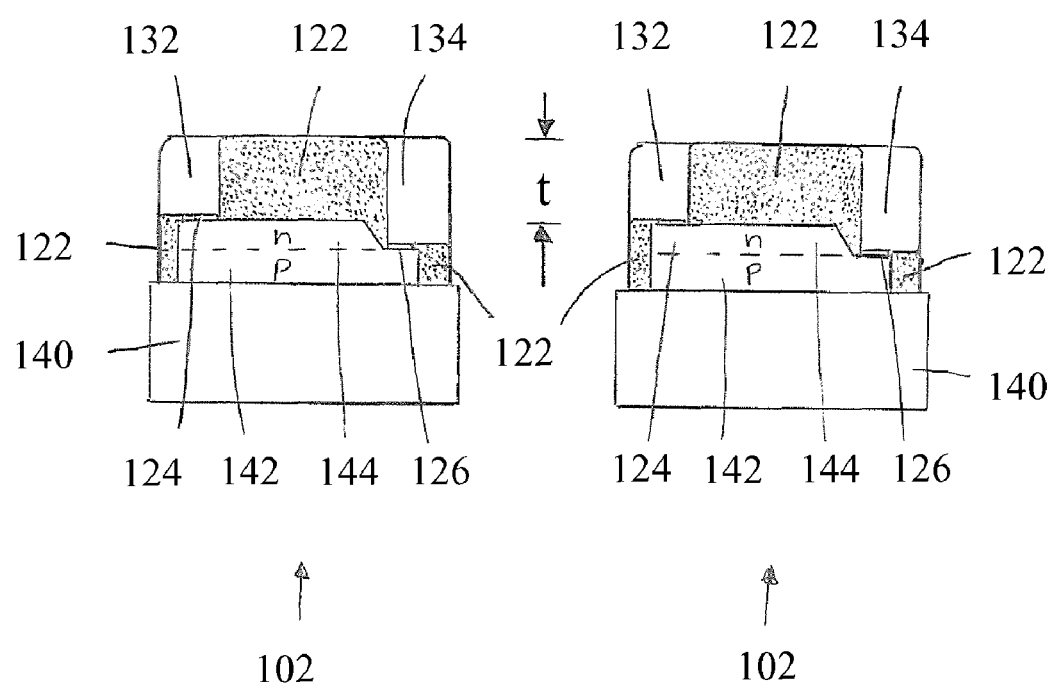

The thickness "t" (measured from the light emitting surface of the LED chip—see FIG. 6g) of the final phosphor/polymer layer 122 is typically of order 100 µm to 200 µm. As in the case of the weight loading of the phosphor to polymer, the thickness "t" of the phosphor/polymer layer 122 will depend on the target CCT of light generated by the device.

As is known there can be a significant variation in both intensity and wavelength of light emitted from individual LED chips that are nominally the same. In order to determine the required thickness t and weight loading of the phosphor/polymer layer 122 the LED wafer can be first mapped by powering individual LEDs on the LED wafer using probes and the intensity and wavelength of emitted light from each measured. Every LED on the LED wafer can be mapped or a representative sample, such as ≈50%, mapped. The required weight loading of phosphor material to light transmissive polymer and thickness t of the phosphor/polymer layer 122 to achieve a selected CCT is calculated from the LED mapping. The phosphor loading and/or thickness t can be matched to the LED chips requiring the least amount of phosphor to avoid the need to remove phosphor. Those devices out of specification can be brought within specification by adding additional to the device. Alternatively the loading and/or thickness of the phosphor/polymer layer 122 can be matched to maximize the number of devices having a selected having CCT of the emission product. The thickness t of the phosphor/polymer layer 122 is determined by the depth "d" of the cells 150 (FIG. 5a).

Step 2—FIGS. 6b and 6c: Before curing the polymer material the stamp 146 is accurately positioned over the wafer such that each pillar 152, 154 overlies a corresponding LED electrode contact pad 124, 126. The stamp 146 is then brought down into engagement with the phosphor/polymer layer 122 until the ribs 148 come into contact with the surface of the wafer 140 between LED chips. Any excess phosphor/polymer material 160 is expelled through the through-hole 156 associated with each cell 150. As can be seen from FIG. 5c the thickness of the ribs 148 is configured such that a layer of phosphor/polymer material remains on the edges of each LED chip.

Step 3—FIG. 6d: The excess phosphor/polymer material 160 is removed from the surface of the stamp using for example a flexible blade (e.g. squeegee) and with the stamp in situ the polymer material is then cured by exposing the phosphor/polymer material 122 to U.V. radiation 162 through the stamp 146. When using a thermally curable polymer material the curing of the polymer can be assisted by heating the stamp. Alternatively, the LED wafer and stamp can be place in a temperature controlled environment to cure the polymer. It will be appreciated that in the case where the polymer material cures at room temperature the curing can be achieved by waiting a pre-selected period of time and therefore the invention applies to both actively and passively curing the polymer material.

Step 4—FIG. 6e: Once the polymer has fully cured the stamp 146 is removed by dissolving it in a suitable solvent such as for example water where the stamp is fabricated from a PVA. After removal of the stamp each LED chip 102 has a layer of phosphor/polymer 122 over its upper light emitting surface and over each of its edges. Furthermore the phosphor/polymer coating has respective holes 132, 134 for accessing the LED's electrode contact pads 124, 126. As can be seen in FIG. 6e a film of residual phosphor/polymer material 168, 170 will respectively remain on each electrode pad 124, 126 and a residual film 172 on the base of each groove 164. In one arrangement it is envisaged to coat each electrode contact pad with a release agent prior to applying the phosphor/polymer material in step 1 (FIG. 6a). The release agent preferably comprises a hydrophilic material such as a polyvinyl alcohol (PVA) to prevent adhesion of the polymer material to the LED's electrode contact pads. The release agent can conveniently be applied to the electrode pads by ink jet printing or other deposition techniques that will be apparent to those skilled in the art.

Moreover, as can be seen in FIG. 6e each LED chip 102 additionally has a stump 166 of excess phosphor/polymer material on its upper surface corresponding to the through-hole 156. The stumps 166 can be removed by for example slicing. Alternatively, the through-holes 156 can be configured such that the resulting stump 166 is located on an area of the LED chip that does not emit light or an area where the presence of the stump has minimal effect on the color and/or CCT of light generated by the device. In such an arrangement there is no need to remove the stump 166.

Step 6—FIGS. 6f and 6g: The LED wafer assembly is processed, using for example oxygen plasma ashing, to remove the residual phosphor/polymer material 168, 170 at the base of the holes 132, 134 overlying the electrode pads 124, 126 and the residual phosphor/polymer material 172 on the base of the streets and avenues (slots) 164. The LED wafer 138 is divided into individual devices 102 by breaking (snapping) 174 the wafer (substrate) 140 along lines corresponding to the streets and avenues 164. Alternatively, the LED wafer can be divided by cutting using a diamond saw or by other techniques that will be readily apparent to those skilled in the art. Each LED chip 102 is packaged as previously described in relation to FIG. 3.

Method 2

Figures 7A, 7B:
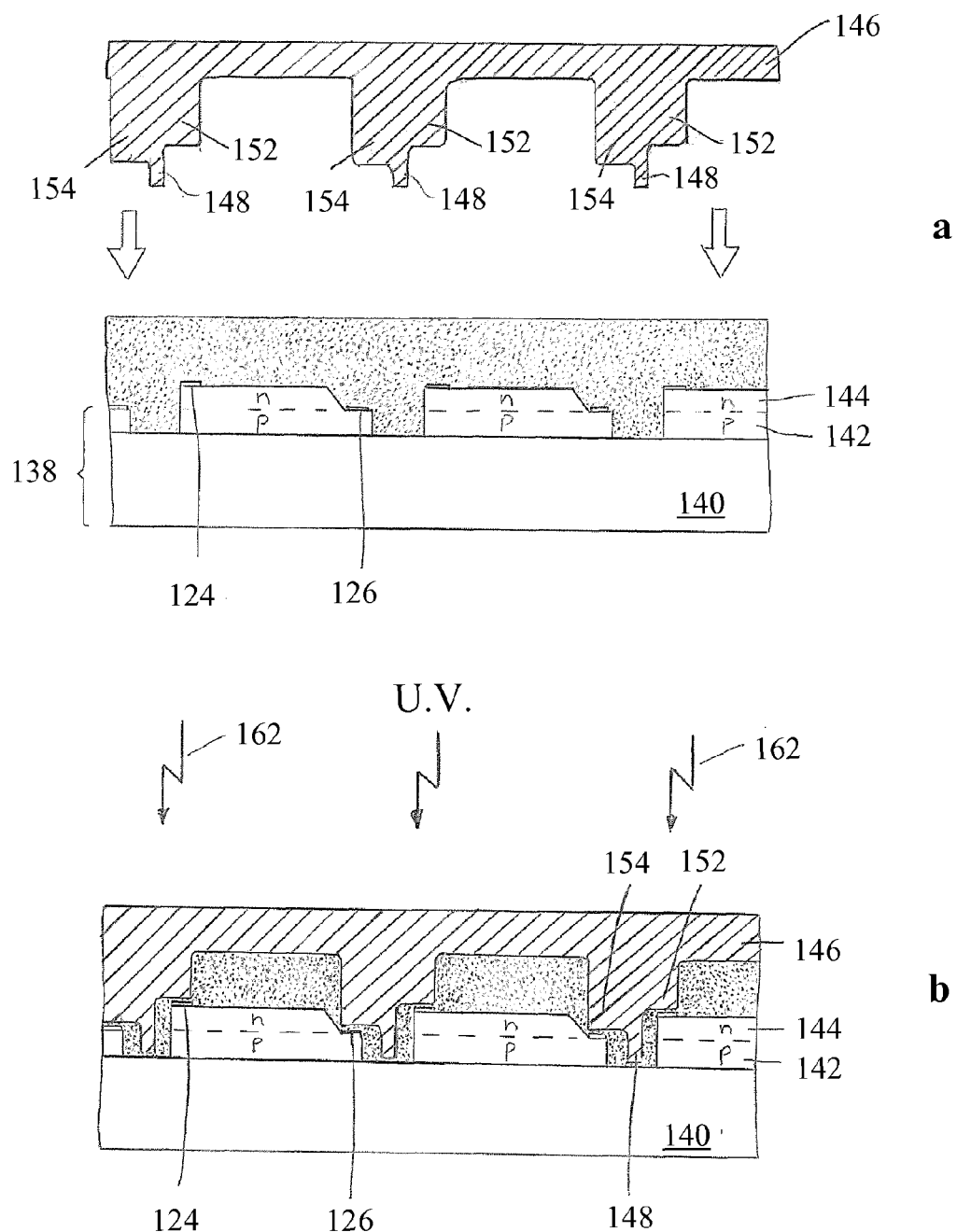
FIGS. 7a to 7c are schematic representations of alternative method steps according to a method of the invention.
Figure 7C:
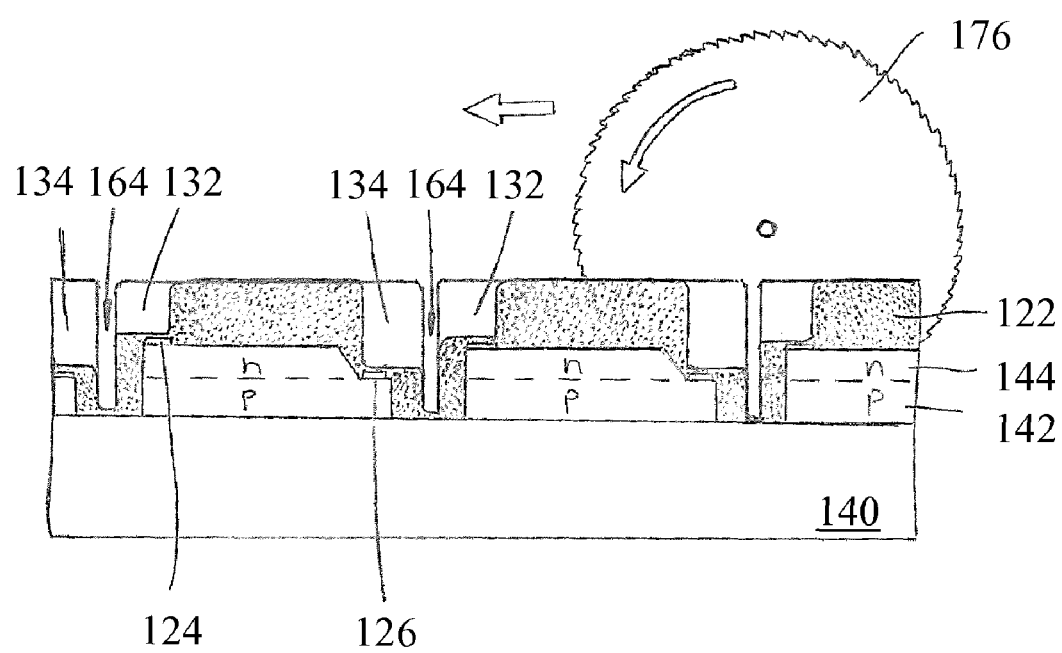

It is envisaged in an alternative method in accordance with the invention to form the streets or avenues 164 by mechanical sawing or by laser ablating the phosphor/polymer layer 122. FIGS. 7a to 7c illustrates such method steps that can be used as an alternative to steps 2 to 4 illustrated in FIGS. 6b to 6e.

In this implementation the stamp 146 is similar in form to the stamp used in the method described above except that it only has a series of parallel ribs 148 that run in a single direction. In FIG. 7a the ribs run in and out of the plane of the paper. The ribs 146 are used to produce a corresponding series of slots 164 (e.g. streets) in the phosphor/polymer coating 122 whilst the avenues are formed by mechanical sawing or laser ablation. Moreover, since the stamp 146 no longer comprises an array of cells the through-holes 156 are no longer required to allow the escape of excess phosphor/polymer material during stamping.

Step 1—FIG. 7a: The phosphor/polymer material is deposited over the entire face of the LED wafer 138. Before curing the polymer material the stamp 146 is accurately positioned over the wafer such that the pillars 152, 154 overlie a corresponding LED electrode pad 124, 126. The stamp 146 is then brought down into engagement with the phosphor/polymer layer 122 until the ribs 148 come into contact with the face of the wafer 140 between LED chips. Excess phosphor polymer material 160 is swept between the ribs 148 and out to the periphery of the LED wafer.

Step 2—FIG. 7b: With the stamp in situ the polymer material is cured by exposing the phosphor/polymer material 122 to U.V. radiation 162 through the stamp. When using a thermally curable polymer the curing of the polymer can be assisted by heating the stamp. Alternatively, the LED wafer and stamp can be place in a temperature controlled environment to cure the polymer.

Step 3—FIG. 7c: The stamp is removed by dissolving the stamp or physically removing it. The remaining slots 164 (e.g. avenues) are then cut by mechanical sawing using for example a diamond saw 176. It is also envisaged to cut the avenues in the phosphor/polymer layer 122 using laser ablation.

The methods in accordance with the invention can be used in the high volume production of light emitting devices with phosphor wavelength conversion. A particular benefit of the methods of the invention is that they can produce devices with a more consistent color and/or CCT and can eliminate the need for binning.

The methods of the invention are suitable for applying phosphor material(s) in a powder form which can comprise an inorganic or organic phosphor such as for example silicate-based phosphor of a general composition $A_3Si(O,D)_5$ or $A_2Si(O,D)_4$ in which Si is silicon, O is oxygen, A comprises strontium (Sr), barium (Ba), magnesium (Mg) or calcium (Ca) and D comprises chlorine (Cl), fluorine (F), nitrogen (N) or sulfur (S). Examples of silicate-based phosphors are disclosed in our co-pending U.S. patent application publication No. US 2007/0029526 A1 and U.S. Pat. No. 7,311,858 B2, U.S. Pat. No. 7,575,697 B2 and U.S. Pat. No. 7,601,276 B2 (all assigned to Internatix Corporation) the content of each of which is hereby incorporated by way of reference thereto.

As taught in U.S. Pat. No. 7,575,697 B2, a europium ($Eu^{2+}$) activated silicate-based green phosphor has the general formula $(Sr,A_1)_x(Si,A_2)(O,A_3)_{2+x}:Eu^{2+}$ in which: $A_1$ is at least one of a $2^+$ cation, a combination of $1^+$ and $3^+$ cations such as for example Mg, Ca, Ba, zinc (Zn), sodium (Na), lithium (Li), bismuth (Bi), yttrium (Y) or cerium (Ce); $A_2$ is a $3^+$, $4^+$ or $5^+$ cation such as for example boron (B), aluminum (Al), gallium (Ga), carbon (C), germanium (Ge), N or phosphorus (P); and $A_3$ is a $1^-$, $2^-$ or $3^-$ anion such as for example F, Cl, bromine (Br), N or S. The formula is written to indicate that the $A_1$ cation replaces Sr; the $A_2$ cation replaces Si and the $A_3$ anion replaces oxygen. The value of x is an integer or non-integer between 1.5 and 2.5.

U.S. Pat. No. 7,311,858 B2 disclose a silicate-based yellow-green phosphor having a formula $A_2SiO_4:Eu^{2+}D$, where A is at least one of a divalent metal comprising Sr, Ca, Ba, Mg, Zn or cadmium (Cd); and D is a dopant comprising F, Cl, Br, iodine (I), P, S and N. The dopant D can be present in the phosphor in an amount ranging from about 0.01 to 20 mole percent and at least some of the dopant substitutes for oxygen anions to become incorporated into the crystal lattice of the phosphor. The phosphor can comprise $(Sr_{1-x-y}Ba_xM_y)SiO_4:Eu^{2+}D$ in which M comprises Ca, Mg, Zn or Cd and where $0 \leq x \leq 1$ and $0 \leq y \leq 1$.

U.S. Pat. No. 7,601,276 B2 teach a two phase silicate-based phosphor having a first phase with a crystal structure substantially the same as that of $(M1)_2SiO_4$; and a second phase with a crystal structure substantially the same as that of $(M2)_3SiO_5$ in which M1 and M2 each comprise Sr, Ba, Mg, Ca or Zn. At least one phase is activated with divalent europium ($Eu^{2+}$) and at least one of the phases contains a dopant D comprising F, Cl, Br, S or N. It is believed that at least some of the dopant atoms are located on oxygen atom lattice sites of the host silicate crystal.

US 2007/0029526 A1 disclose a silicate-based orange phosphor having the formula $(Sr_{1-x}M_x)_yEu_zSiO_5$ in which M is at least one of a divalent metal comprising Ba, Mg, Ca or Zn; $0<x<0.5$; $2.6<y<3.3$; and $0.001<z<0.5$. The phosphor is configured to emit visible light having a peak emission wavelength greater than about 565 nm.

The phosphor can also comprise an aluminate-based material such as is taught in our co-pending U.S. patent application publication No. US 2006/0158090 A1 and U.S. Pat. No. 7,390,437 B2 (also assigned to Internatix Corporation) or an aluminum-silicate phosphor as taught in co-pending application US 2008/0111472 A1 the content of each of which is hereby incorporated by way of reference thereto.

US 2006/0158090 A1 to Wang et al. teach an aluminate-based green phosphor of formula $M_{1-x}Eu_xAl_yO_{[1+3y/2]}$ in which M is at least one of a divalent metal comprising Ba, Sr, Ca, Mg, manganese (Mn), Zn, copper (Cu), Cd, samarium (Sm) or thulium (Tm) and in which $0.1<x<0.9$ and $0.5 \leq y \leq 12$.

U.S. Pat. No. 7,390,437 B2 disclose an aluminate-based blue phosphor having the formula $(M_{1-x}Eu_x)_{2-z}Mg_zAl_yO_{[2+3y/2]}$ in which M is at least one of a divalent metal of Ba or Sr. In one composition the phosphor is configured to absorb radiation in a wavelength ranging from about 280 nm to 420 nm, and to emit visible light having a wavelength ranging from about 420 nm to 560 nm and $0.05<x<0.5$ or $0.2<x<0.5$; $3 \leq y \leq 12$ and $0.8 \leq z \leq 1.2$. The phosphor can be further doped with a halogen dopant H such as Cl, Br or I and be of general composition $(M_{1-x}Eu_x)_{2-z}Mg_zAl_yO_{[2+3y/2]}:H$.

US 2008/0111472 A1 to Liu et al. teach an aluminum-silicate orange-red phosphor with mixed divalent and trivalent cations of general formula $(Sr_{1-x-y}M_xT_y)_{3-m}Eu_m(Si_{1-z}Al_z)O_5$ in which M is at least one divalent metal selected from Ba, Mg or Ca in an amount ranging from $0 \leq x \leq 0.4$; T is a trivalent metal selected from Y, lanthanum (La), Ce, praseodymium (Pr), neodymium (Nd), promethium (Pm), Sm, gadolinium (Gd), terbium (Tb), dysprosium (Dy), holmium (Ho), Erbium (Er), Tm, ytterbium (Yt), lutetium (Lu), thorium (Th), protactinium (Pa) or uranium (U) in an amount ranging from $0 \leq y \leq 0.4$ and z and m are in a range $0 \leq z \leq 0.2$ and $0.001 \leq m \leq 0.5$. The phosphor is configured such that the halogen resides on oxygen lattice sites within the silicate crystal.

The phosphor can also comprise a nitride-based red phosphor material such as is taught in our co-pending U.S. patent applications Publication No. US 2009/0283721 A1 published Nov. 19, 2009 and Ser. No. 12/632,550 filed Dec. 7, 2009 entitled "Nitride-based red-emitting phosphors in RGB (red-green-blue) lighting systems", the content of each of which is hereby incorporated by way of reference thereto. US 2009/0283721 A1 and 12/632,550 teach nitride-based red phosphor having the formula $M_m M_a M_b D_{3w} N_{[(2/3)m+z+a+(4/3)b-w]} Z_x$ where $M_m$ is a divalent element selected from beryllium (Be), Mg, Ca, Sr, Ba, Zn, Cd or mercury (Hg); $M_a$ is a trivalent element selected from B, Al, Ga, indium (In), Y, selenium (Se), P, arsenic (As), La, Sm, antimony (Sb) or Bi; $M_b$ is a tetravalent element selected from C, Si, Ge, tin (Sn), Ni, hafnium (Hf), molybdenum (Mo), tungsten (W), chromium (Cr), lead (Pb), titanium (Ti) or zirconium (Zr); D is a halogen selected from F, Cl, Br or I; Z is an activator selected from europium (Eu), Ce, manganese (Mn), Tb or samarium (Sm), and N is nitrogen in amounts $0.01 \leq m \leq 1.5$, $0.01 \leq a \leq 1.5$, $0.01 \leq b \leq 1.5$, $0.0001 \leq w \leq 0.6$ and $0.0001 \leq z \leq 0.5$. The phosphor is configured to emit visible light with an emission peak wavelength greater than 640 nm.

It will be appreciated that the phosphor material is not limited to the examples described herein and can comprise any phosphor material including both organic or inorganic phosphor materials such as for example nitride and/or sulfate phosphor materials, oxy-nitrides and oxy-sulfate phosphors or garnet materials (YAG).

It will be further appreciated that the present invention is not restricted to the specific embodiments described and that variations can be made that are within the scope of the invention. For example, the method of the invention can be used to the application/processing of the phosphor/polymer layer on other LED wafers such as silicon carbide (SiC), zinc selenide (ZnSe), indium gallium nitride (InGaN), aluminum nitride (AlN) or aluminum gallium nitride (AlGaN) based LED chips.

It is also envisaged in other implementations to use a reusable removable stamp to profile the phosphor/polymer material. The stamp can comprise for example a metal such as stainless steel, a polymer material such as a polycarbonate, an acrylic, a silicone or an epoxy or a glass. Preferably the stamp further comprises a coating of, or is fabricated from, a non-stick material such as PTFE (polytetrafluoroethylene) for example Teflon® ("Teflon" is a registered trademark of Du Pont) to aid in the removal of the stamp. Moreover, the stamp can be resiliently deformable to assist in its removal and a release agent can be used to further aid in removal of the stamp.

What is claimed is:

1. A method of manufacturing a light emitting device comprising:
   a) depositing over substantially the entire surface of an LED wafer having an array of LEDs formed on a surface thereof a mixture of at least one phosphor material and a light transmissive polymer material, wherein the polymer material is transmissive to light generated by the LEDs and to light generated by the at least one phosphor material;
   b) mechanically stamping the phosphor/polymer mixture with a stamp having features configured such as to form passages in the phosphor/polymer corresponding to electrode contact pads of each LED thereby enabling access to each electrode contact pad;
   c) curing the polymer;
   d) removing the stamp; and
   e) dividing the wafer into individual light emitting devices.

2. The method according to claim 1, wherein the stamp is configured to determine a resulting thickness of the phosphor/polymer material.

3. The method according to claim 2 and comprising selecting the thickness of the phosphor/polymer material and weight loading of the at least one phosphor material to polymer material of the phosphor/polymer material on a basis of LEDs on the LED wafer having substantially the same emission characteristics.

4. The method according to claim 3, wherein the LEDs having substantially the same emission characteristics emit light of substantially the same intensity and/or emission wavelength.

5. The method according to claim 3, and comprising selecting the thickness of the phosphor/polymer material and weight loading of the at least one phosphor material to polymer material of the phosphor/polymer material to correspond to LEDs requiring a least amount of phosphor material.

6. The method according to claim 3, and comprising selecting the thickness of the phosphor/polymer material and weight loading of the at least one phosphor material to polymer material of the phosphor/polymer material to correspond to the greatest number of LEDs on the LED wafer having substantially the same emission characteristics.

7. The method according to claim 1, wherein the stamp further comprises features for defining slots in the phosphor/polymer material that are configured to pass between individual LEDs.

8. The method according to claim 7, wherein the stamp is fabricated from polyvinyl alcohol.

9. The method according to claim 1, wherein the polymer is ultra violet curable and the stamp comprises a material which substantially transmissive to ultra violet radiation and comprising in c) irradiating the phosphor/polymer mixture with ultra violet radiation through the stamp.

10. The method according to claim 1, wherein the polymer material is thermally curable and comprising heating the stamp to cure the polymer material.

11. The method according to claim 1, wherein the polymer material is selected from the group consisting of: silicone and an epoxy material.

12. The method according to claim 1, and prior to dividing the LED wafer in e) further comprising processing the LED wafer to remove phosphor/polymer overlying the electrode contact pads.

13. The method according to claim 12, and comprising plasma ashing the LED wafer to remove phosphor/polymer overlying the electrode contact pads.

14. The method according to claim 1, and comprising dividing the LED wafer by a method selected from the group consisting of: scribing and breaking, laser ablation and sawing.

15. The method according to claim 1, and further comprising packaging each light emitting device.

16. The method according to claim 1, wherein the stamp is at least in part flexible to thereby aid removal of the stamp.

17. The method according to claim 14, and further comprising using a release agent to aid in removal of the stamp.

18. A light emitting device with phosphor wavelength conversion manufactured according to the method of claim 1.

19. The method according to claim 1, and further comprising cutting the slots in the phosphor/polymer material that are configured to pass between individual LEDs.

20. The method according to claim 19, wherein the slot further extend into the wafer to thereby aid in subsequent division of the wafer.

21. The method according to claim 19, wherein the slots are cut by a method selected from the group consisting of laser ablation and mechanical sawing.

22. The method according to claim 2, wherein the slots are configured such that a layer of phosphor/polymer material remains on the edges of each LED after division of the wafer into individual devices.

23. The method according to claim 1, wherein the stamp comprises a dissolvable material and wherein the stamp is removed by dissolving it using a solvent.

* * * * *